(12) United States Patent
Chong et al.

(10) Patent No.: US 8,912,567 B2
(45) Date of Patent: Dec. 16, 2014

(54) STRAINED CHANNEL TRANSISTOR AND METHOD OF FABRICATION THEREOF

(75) Inventors: Yung Fu Chong, Singapore (SG);
Zhijiong Luo, Carmel, NY (US);
Judson Holt, Wappinger Falls, NY (US)

(73) Assignees: GLOBALFOUNDRIES Singapore Pte. Ltd., Singapore (SG); International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/852,995

(22) Filed: Aug. 9, 2010

(65) Prior Publication Data

US 2010/0320503 A1    Dec. 23, 2010

Related U.S. Application Data

(63) Continuation of application No. 11/383,951, filed on May 17, 2006, now Pat. No. 7,772,071.

(51) Int. Cl.
*H01L 29/78* (2006.01)
*H01L 29/66* (2006.01)

(52) U.S. Cl.
CPC ....... *H01L 29/66628* (2013.01); *H01L 29/6656* (2013.01); *H01L 29/66636* (2013.01); *H01L 29/6653* (2013.01); *H01L 29/66545* (2013.01)

USPC .................... 257/190; 438/300; 257/E29.266

(58) Field of Classification Search
CPC .................... H01L 29/66628; H01L 29/6653; H01L 29/66545
USPC ........................................... 257/190; 438/300
See application file for complete search history.

(56) References Cited

U.S. PATENT DOCUMENTS

| | | | |
|---|---|---|---|
| 6,797,556 B2 | 9/2004 | Murthy et al. | |
| 6,867,428 B1 | 3/2005 | Besser et al. | |
| 6,881,635 B1 | 4/2005 | Chidambarrao et al. | |
| 7,413,961 B2 | 8/2008 | Chong et al. | |
| 2006/0024872 A1* | 2/2006 | Goodlin et al. | 438/196 |

* cited by examiner

*Primary Examiner* — Alexander Ghyka

(57) ABSTRACT

The present invention relates to semiconductor integrated circuits. More particularly, but not exclusively, the invention relates to strained channel complimentary metal oxide semiconductor (CMOS) transistor structures and fabrication methods thereof. A strained channel CMOS transistor structure comprises a source stressor region comprising a source extension stressor region; and a drain stressor region comprising a drain extension stressor region; wherein a strained channel region is formed between the source extension stressor region and the drain extension stressor region, a width of said channel region being defined by adjacent ends of said extension stressor regions.

39 Claims, 11 Drawing Sheets

STRAINED CHANNEL TRANSISTOR AND METHOD OF FABRICATION THEREOF

CROSS-REFERENCE TO RELATED APPLICATION(S)

This is a continuation of U.S. patent application Ser. No. 11/383,951 filed May 17, 2006, now U.S. Pat. No. 7,772,071.

FIELD OF THE INVENTION

The present invention relates to semiconductor integrated circuits. More particularly, but not exclusively, the invention relates to strained channel complimentary metal oxide semiconductor (CMOS) transistor structures and fabrication methods thereof.

DESCRIPTION OF THE RELATED ART

Integrated circuits comprising many thousands of semiconductor devices play an important role in a number of technology areas. The continued development of devices with higher performance at reasonable cost is important to the future development of many of these technologies. Metal oxide semiconductor field effect transistors (MOSFETs) are commonly used in semiconductor integrated circuits. It has been shown that the performance of a MOSFET device may be enhanced by the application of mechanical stresses to portions of the device.

A known MOSFET 10 is shown schematically in FIG. 1 (PRIOR ART). A MOSFET 10 is typically fabricated on a semiconductor substrate 12 such as silicon and has a source region 15 (also known as a 'deep' source region) and a drain region 16 (also known as a 'deep' drain region) separated by a conduction channel 17.

A gate stack 18 is provided over the conduction channel 17 (hereinafter referred to as the 'channel'). The gate stack 18 is formed from a gate dielectric layer 19 above the channel 17, and a gate electrode 20 above the gate dielectric layer 19. The application of a potential to the gate electrode 20 allows a flow of current through the channel 17 between the source 15 and the drain 16 to be controlled.

The gate stack 18 is provided with spacer elements 21, 22 on a source side and a drain side, respectively, of the gate stack 18. The purpose of the spacer elements 21, 22 is to define boundaries of the source and drain regions 15, 16 with respect to the channel 17. For example, the source and drain regions 15, 16 may be made by implantation of the substrate 12 with dopant.

The spacer elements 21, 22 may serve as an implantation mask during formation of the source and drain regions 15, 16 to define the boundary between the source and drain regions 15, 16 and the channel 17. Alternatively, the source and drain regions 15, 16 may be made by etching a source recess and a drain recess, and filling the recesses with in-situ doped silicon. In this case, the spacer elements 21, 22 serve to protect the underlying substrate from the effects of the etching process.

The source 15 and drain 16 also have shallow extension regions 25, 26, respectively. The presence of shallow extension regions 25, 26 near the ends of the channel 17 helps to reduce short channel effects, thereby improving the performance of the device.

The performance of a MOSFET device may be further improved by providing 'halo' regions 27, 28 between the substrate 12 and shallow source and drain extensions 25, 26. The halo regions 27, 28 are formed by implantation of the substrate with a dopant of opposite conductivity type to that used to form the source and drain extensions 25, 26. By way of example, in an n-type FET (nFET) formed on a silicon substrate, the source and drain extensions may be made by implanting a silicon substrate with an n-type dopant such as arsenic or phosphorous. Halo regions in this device would be formed by implanting the substrate with a p-type dopant such as boron.

The purpose of forming the halo regions 27, 28 is to suppress 'punchthrough', one of several short channel effects that degrade the performance of the device. Punchthrough occurs when the channel length of the device is sufficiently short to allow the depletion regions at the ends of the source and drain extensions to overlap, leading to a breakdown condition. Although punchthrough is generally avoided by appropriate circuit design, the presence of the halo regions 27, 28 shortens the depletion regions at the ends of the source and drain extensions 25, 26. This allows the fabrication of devices having shorter channel regions whilst still avoiding breakdown by punchthrough.

A recent advance in the development of higher performance MOSFET devices has been the inclusion of strained silicon regions in the device. It has been found that the drive current of an nFET may be enhanced by applying a tensile stress along the length of the channel 17. The performance of a p-type FET (pFET) may be enhanced by applying a compressive stress along the length of the channel 17 instead of a tensile stress.

However, if a compressive stress is applied along the length of the channel 17 of an nFET the performance of the nFET is degraded. Similarly, if a tensile stress is applied along the length of the channel 17 of a pFET, the performance of the pFET is degraded.

A number of methodologies have been developed for introducing a strain along the length of the channel 17. These include the growth of an epitaxial layer (hereinafter referred to as an epilayer) of a semiconductor material having a first natural lattice constant on top of a substrate 12 having a second natural lattice constant different from the first. A biaxially strained epitaxial layer of the overlying semiconductor material may thereby be formed. By natural lattice constant is meant the lattice constant of the bulk, unstrained crystalline material.

For example, the epitaxial layer may be formed from silicon, and the substrate may be formed from a silicon germanium alloy (hereinafter referred to as silicon germanium). Silicon has a natural lattice constant of approximately 5.43 Å. Silicon germanium has a natural lattice constant of between 5.43 Å and 5.66 Å, depending upon the concentration of germanium in the alloy. The higher the concentration of germanium, the larger the natural lattice constant of the alloy. Since the natural lattice constant of silicon germanium is higher than that of silicon, the entire silicon epilayer will be in a state of biaxial tensile stress. U.S. Pat. No. 6,867,428 (BESSER et al.) discloses a strained silicon nFET having a strained silicon channel formed in such an epilayer.

An alternative approach to the formation of a strained channel region is to use an unstrained silicon substrate and introduce strain into the channel by forming stressor regions within each of the source and drain regions of the device. A stressor region is formed from an epitaxial material having a lattice constant different to that of the substrate. If the natural lattice constant of the stressor material is larger than that of the substrate, the stressor regions will exert a compressive stress on the channel. In the case of a silicon substrate, the inclusion of epitaxial silicon-germanium stressor regions will create a compressive stress in the channel.

Silicon-carbon alloy (hereinafter referred to as silicon carbon) has a smaller natural lattice constant than silicon, and may also be grown epitaxially on silicon. The inclusion of an epitaxial silicon carbon stressor region within the source and drain regions produces a tensile stress along the length of the channel.

In certain advanced device structures it is desirable to have the stressor regions as close to the channel as possible in order to further optimise the stress applied to the channel. Thus, stressor regions may be formed within the source and drain extension regions. The extension regions may undercut spacers formed on sidewalls of the gate stack. However, this has proved difficult to achieve in practice.

The source and drain stressors may be formed by implantation of the substrate. For example, germanium may be implanted into a silicon substrate to form a silicon germanium alloy. Alternatively, source and drain recesses may be formed in the silicon substrate, and an epitaxial stressor material such as silicon germanium deposited in the recesses.

In several known transistor structures having source/drain extension stressors the channel region is not defined by ends of the source/drain extension stressors. Rather, the source/drain extension stressors lie within a boundary of the source/drain extension region, such that a region of doped silicon is provided between the stressor region and respective ends of the source/drain extension regions.

Methods of forming the source and drain extension stressors by etching of the substrate may be adapted to form source and drain stressor extension recesses by exploiting a feature of isotropic etching processes known as 'undercut'. If the source and drain recesses are formed by an isotropic etching technique, removal of portions of the substrate underlying spacer elements 21, 22 will occur. This phenomenon is known as 'undercut'.

A disadvantage of isotropic etching processes, however, is that they are difficult to control. Isotropic etching processes may be affected by the presence of residual film on the surface of the device. In addition they may be affected by microloading effects arising from nearby protective layers. It is therefore difficult to ensure that source and drain stressor extension recesses formed by isotropic etching are of a reproducible morphology. By protective layers are meant layers that are used to protect areas of the substrate that are not to be etched to form a recess.

Solutions to these problems have been long sought but prior developments have not taught or suggested any solutions and, thus, solutions to these problems have long eluded those skilled in the art.

SUMMARY OF THE INVENTION

It is an object of the present invention to at least partly mitigate the above-mentioned problems.

It is a further object of embodiments of the invention to provide an improved transistor structure with a strained channel region.

Another object of embodiments of the present invention is to provide a fabrication method for a strained channel transistor structure.

According to a first aspect of the present invention there is provided a strained channel transistor structure, comprising: a source stressor region comprising a source extension stressor region; and a drain stressor region comprising a drain extension stressor region; wherein a strained channel region is formed between the source extension stressor region and the drain extension stressor region, a width of said channel region being defined by adjacent ends of said extension stressor regions.

According to a second aspect of the present invention there is provided a strained channel transistor structure, comprising: a source stressor region; and a drain stressor region; wherein each stressor region comprises a lower stressor region and an upper stressor region, said upper stressor region comprising a stressor extension region; and a width of at least one of said source and/or drain upper stressor regions is greater than a width of the lower stressor region.

According to a third aspect of the present invention there is provided a method of forming a strained channel transistor structure on a substrate comprising a first semiconductor material, comprising the steps of: forming a source stressor region comprising a source extension stressor region; and forming a drain stressor region comprising a drain extension stressor region; whereby a channel region is formed between said source extension stressor region and said drain extension stressor region, said channel region having a width defined by adjacent ends of said extension stressor regions.

According to a fourth aspect of the present invention there is provided a method of forming a strained channel transistor structure, comprising the steps of: forming a source stressor region comprising an upper source stressor region and a lower source stressor region, the upper source stressor region comprising a source extension stressor region; and forming a drain stressor region comprising an upper drain stressor region and a lower drain stressor region, the upper drain stressor region comprising a drain extension stressor region; whereby the upper stressor regions are formed to have a width greater than a width of the lower stressor region.

Embodiments of the present invention provide a number of advantages over the prior art. In some embodiments of the present invention, the stressors are formed in the entire source/drain and source/drain extension regions. Thus, the width of the channel region is defined by adjacent ends of the extension stressor regions. This has the advantage that a level of strain in the channel may be made higher than in prior art devices where stressors are formed only in portions of the source/drain and source/drain extension regions. In other embodiments, the width of the channel region is not exactly defined by adjacent ends of the extension stressor regions, due to a blurring effect at the interface between the stressor and substrate caused by diffusion of dopants from the extension stressor regions toward the channel during a subsequent spike anneal step. Nevertheless, extension stressor regions are extremely close to the channel region.

Furthermore, in embodiments of the present invention the source/drain and source/drain extension stressor regions are formed by means of a two-step etch and epitaxy process. An advantage of the two-step etch and epitaxy process is that boundaries of the source/drain stressor regions may be made highly abrupt. This enables highly abrupt junctions to be formed between the source/drain extension stressor regions and the strained channel region, allowing improved short channel behaviour to be attained. The two-step etch and epitaxy process also enables a source/drain extension recess to be formed having a depth that is less than that of the rest of the source/drain recess. This has the advantage of improving the stress along the channel by forming the stressor closer to the channel without causing an increase in short channel effects, as would be the case if the source/drain extension recess was made more deep.

During the process of growing source/drain and source/drain extension stressor regions according to embodiments of the invention, the source/drain and source/drain extension stressor regions may be doped in-situ. An advantage of this feature is that the source and drain extension stressor regions may be made highly activated. If the source/drain and source/drain extension stressor regions are not doped in-situ, conventional ion implantation and annealing can be performed to form doped source/drain and source/drain extension stressor regions.

BRIEF DESCRIPTION OF THE DRAWINGS

Embodiments of the present invention will now be described hereinafter, by way of example only, with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Figure 1:
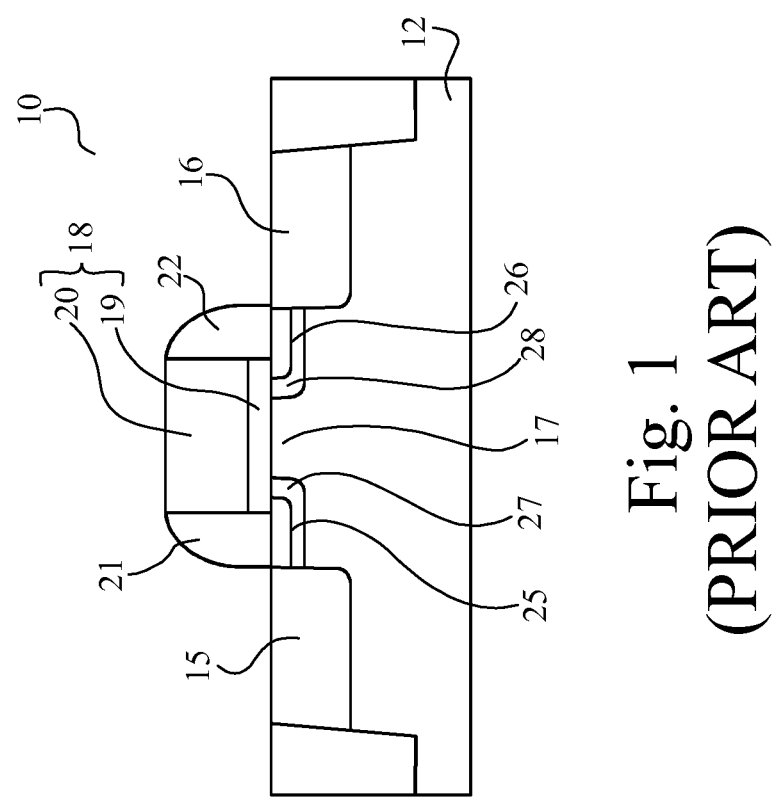
FIG. 1 (PRIOR ART) is a cross-section illustrating a prior art MOSFET device.
Figure 2A:
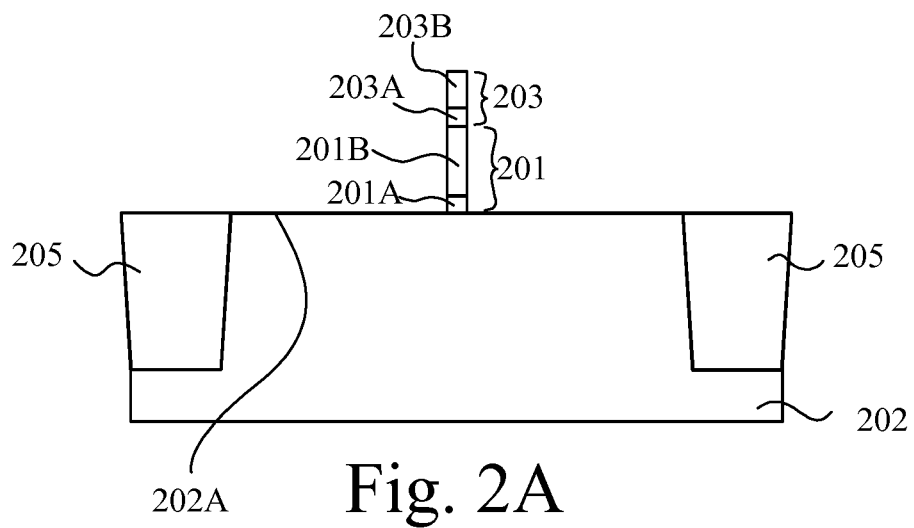
FIGS. 2A, 2B, 2C, 2D, 2E, 2F, 2G, 2H, 2I, 2J, 2K, and 2L show structures formed during a process of fabrication of a MOSFET in accordance with an embodiment of the invention.
Figure 2B:
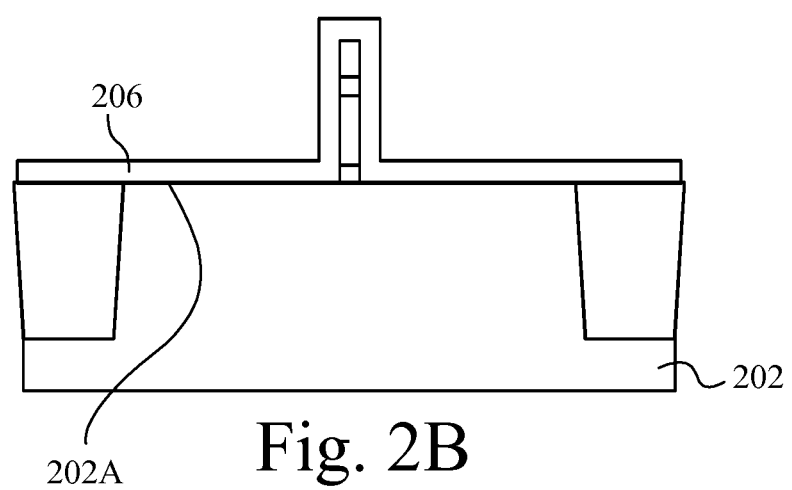
Figure 2C:
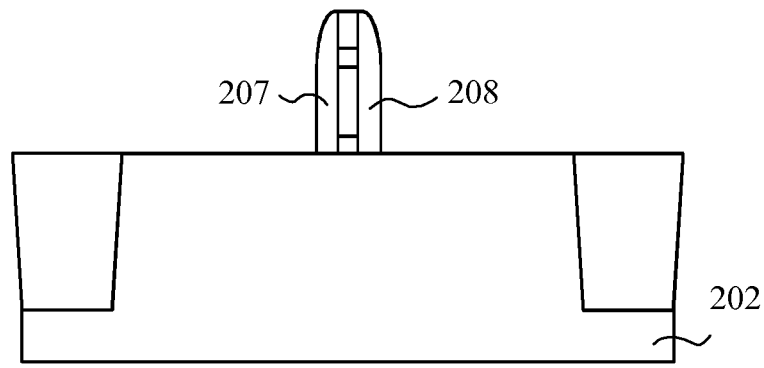
Figure 2D:
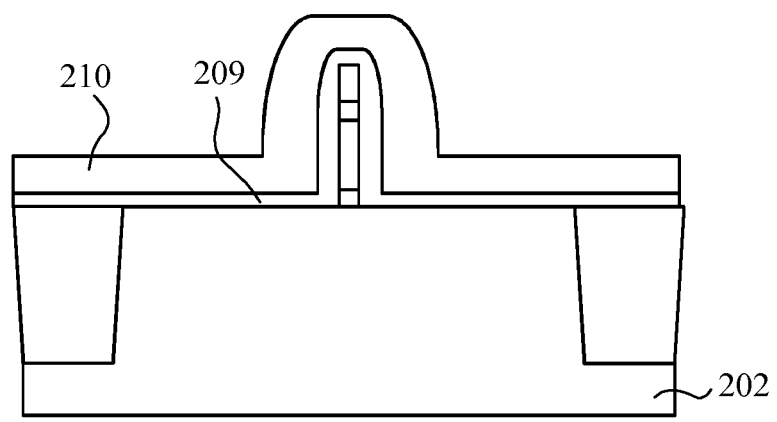
Figure 2E:
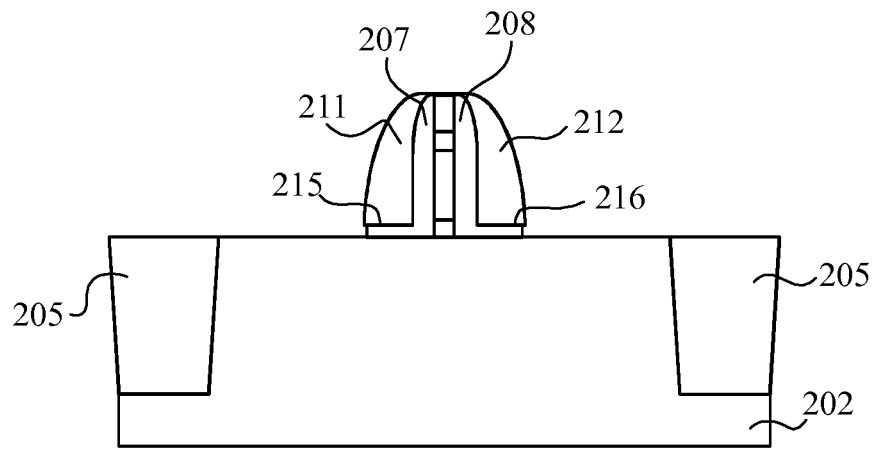
Figure 2F:
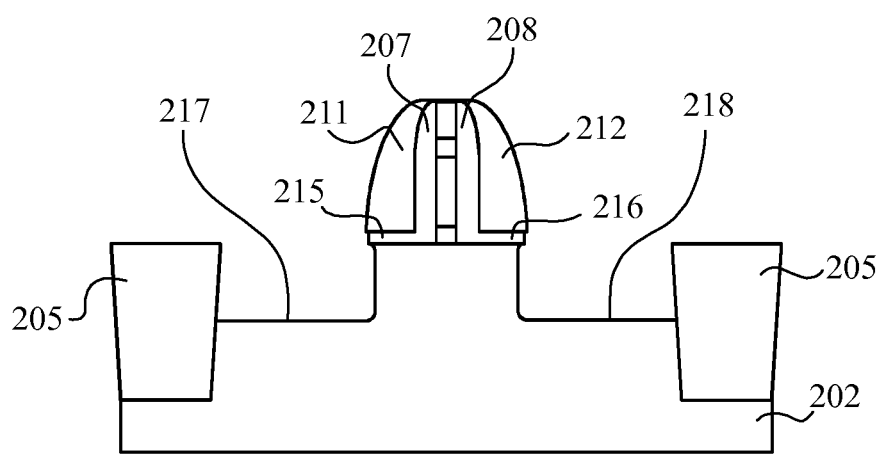
Figure 2G:
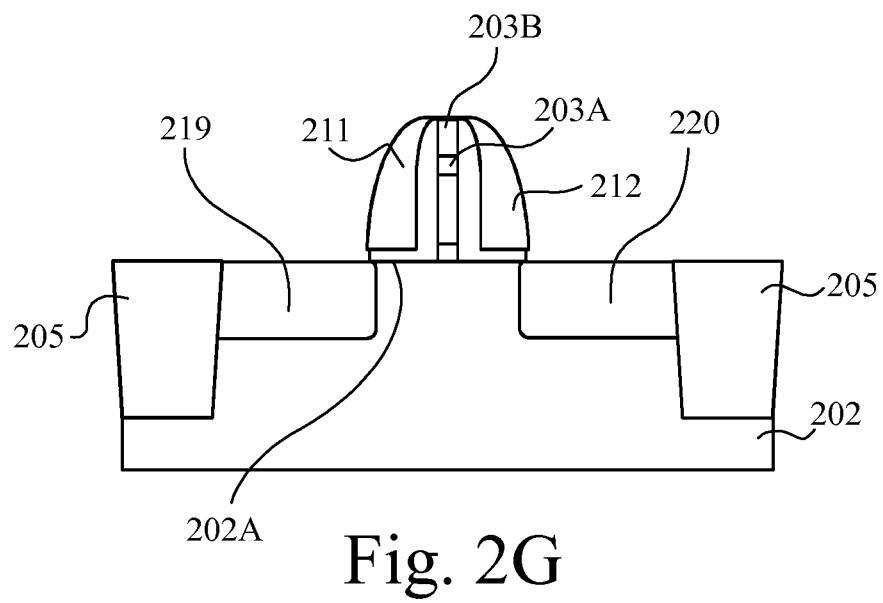
Figure 2H:
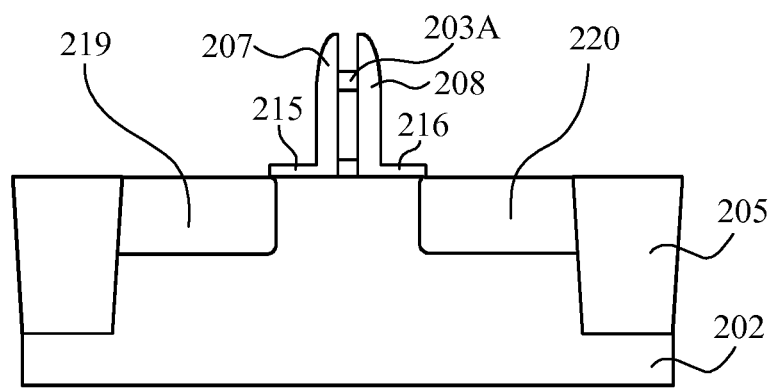
Figure 2I:
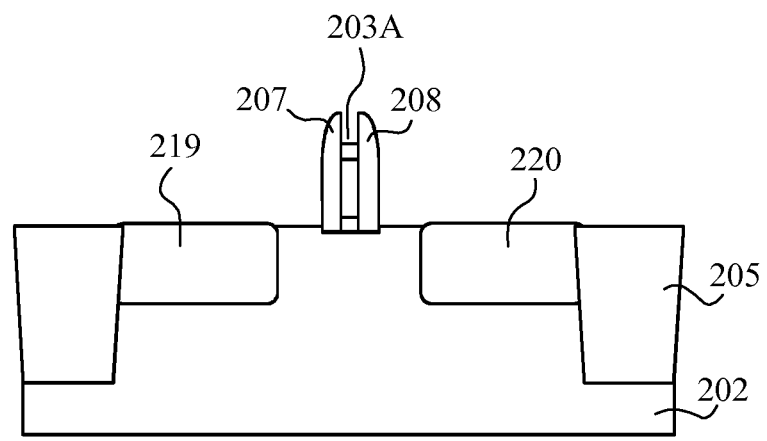
Figure 2J:
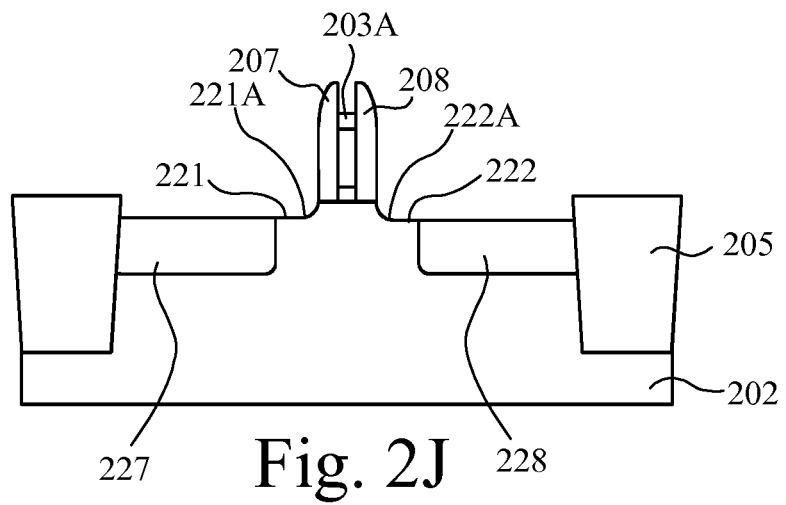
Figure 2K:
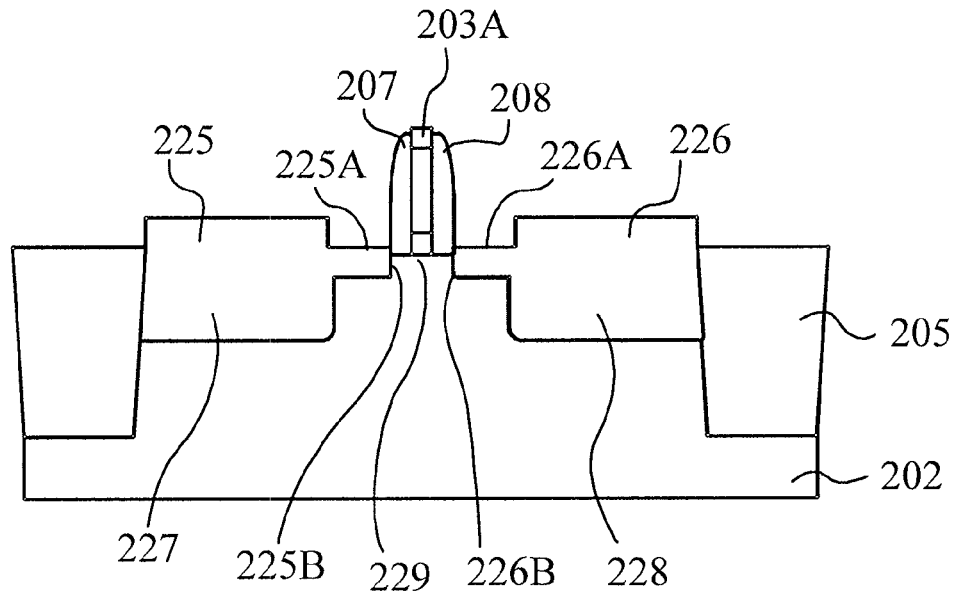
Figure 2L:
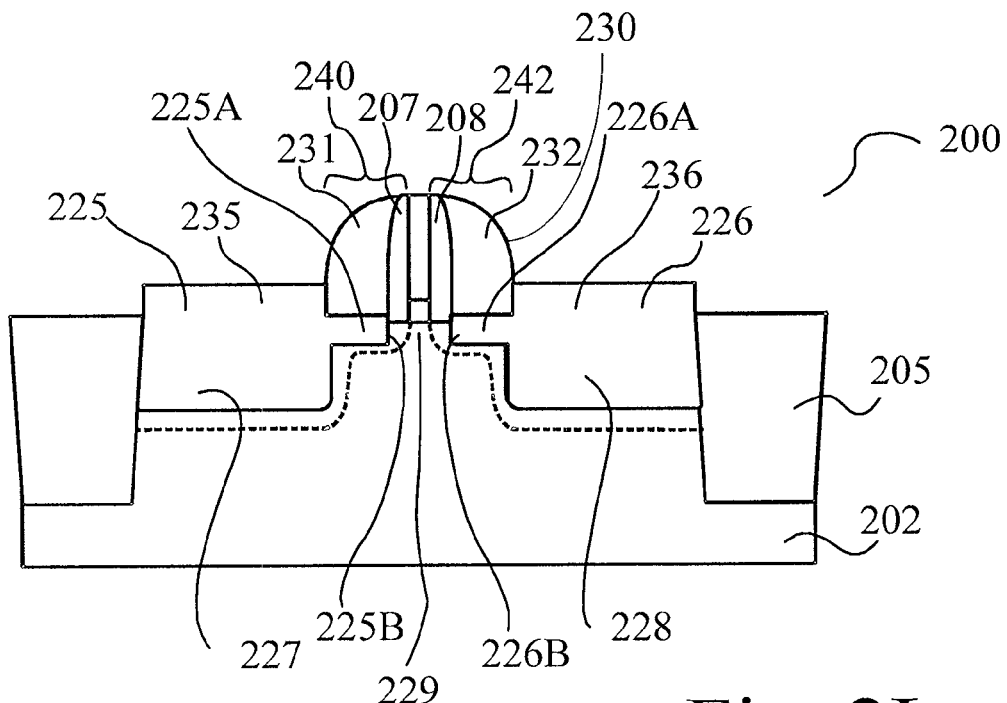

FIGS. 2A to 2L illustrate structures formed during fabrication of a strained channel transistor structure 200 (FIG. 2L) in accordance with a first embodiment of the present invention. The final transistor structure 200 is illustrated in FIG. 2L.

FIG. 2A shows a structure having a gate structure 201 formed on a substrate 202 of a first semiconductor material which is silicon. Whilst the first semiconductor material is described here as silicon it will be understood that other materials such as germanium or GaAs or others could be used. The gate structure 201 has a gate insulating layer 201A formed on the silicon substrate 202 and a gate electrode 201B formed above the gate insulator layer 201A.

The gate insulator layer 201A is silicon oxide but it will be appreciated that other materials could be used such as silicon nitride, aluminium oxide, hafnium oxide or others alone or in combination, for example a combination of layers of silicon oxide and silicon nitride. Silicon oxide may be grown by thermal oxidation of the silicon substrate. Nitrogen can be introduced into the silicon oxide by means of plasma nitridation or thermal nitridation.

The gate electrode 201B is typically polysilicon, but may alternatively be germanium, nickel silicide, copper, aluminium or others such as polysilicon implanted with a second material such as germanium.

A bilayer hardmask structure 203 is formed above the gate structure 201. The bilayer hardmask structure 203 has a lower hardmask layer 203A and an upper hardmask layer 203B. Advantageously, the lower hardmask layer 203A is an oxide hardmask layer and is formed above the gate structure 201. Advantageously, the upper hardmask layer 203B is a nitride hardmask layer and is formed above the lower hard mask layer 203A.

Shallow trench isolation (STI) regions 205 are formed in the substrate 202 between transistor structures 200. The STI regions 205 may be formed by forming trenches having tapered sidewalls in the substrate 202, and filling the trenches with an oxide such as silicon oxide.

FIG. 2B shows the structure of FIG. 2A after the formation of a conformal oxide layer 206 over said structure. Sidewalls of the gate structure 201, and both the sidewalls and a top surface of the bilayer hardmask structure 203, are coated with oxide, in addition to an exposed surface 202A of the substrate 202, in this case an area of the substrate 202 not underlying the gate structure 201. The purpose of forming the conformal oxide layer 206 is to enable the formation of offset spacer elements 207, 208 on or in direct contact with sidewalls of the gate stack 201 and bilayer hardmask structure 203.

The conformal oxide layer 206 may be a low temperature oxide (LTO) deposited by plasma enhanced chemical vapor deposition (PECVD), or an oxide formed by low pressure chemical vapor deposition (LPCVD) or rapid thermal chemical vapor deposition (RTCVD). Advantageously the thickness of the oxide layer is from about 20 Angstroms to about 300 Angstroms.

FIG. 2C shows the structure of FIG. 2B after the conformal oxide layer 206 has been subjected to a step of reactive ion etching. The step of reactive ion etching is performed in order to remove portions of the conformal oxide layer 206 that were formed on surfaces other than those that are substantially perpendicular to the plane of the substrate 202. The step of reactive ion etching results in the formation of offset spacer elements 207, 208 on the sidewalls of the gate stack 201 and bilayer hardmask structure 203.

Following formation of the offset spacer elements 207, 208, an optional Halo implant may be performed.

FIG. 2D shows the structure of FIG. 2C following the deposition of a thin conformal oxide layer 209, and the deposition of a conformal nitride layer 210 over the thin conformal oxide layer 209. The thin conformal oxide layer 209 may be a low temperature oxide (LTO) deposited by plasma enhanced chemical vapor deposition (PECVD). Alternatively the thin conformal oxide layer 209 may be formed by low pressure chemical vapor deposition (LPCVD) or rapid thermal chemical vapor deposition (RTCVD). Advantageously the thin conformal oxide layer 209 is from about 20 Angstroms to about 200 Angstroms in thickness.

The conformal nitride layer 210 may be formed by plasma enhanced chemical vapor deposition (PECVD), low pressure chemical vapor deposition (LPCVD) or rapid thermal chemical vapor deposition (RTCVD). Advantageously the conformal nitride layer 210 is from about 100 Angstroms to about 700 Angstroms in thickness.

FIG. 2E shows the structure of FIG. 2D following the step of reactive ion etching of the conformal nitride layer 210, and removal of areas of the thin conformal oxide layer 209 exposed following reactive ion etching of the conformal nitride layer 210. The areas of the thin conformal oxide layer 209 thereby exposed may be removed by a step of wet etching, a step of dry etching, or any other suitable step of etching.

The step of reactive ion etching of the conformal nitride layer 210 is performed in order to form disposable nitride spacers 211, 212 on the sidewalls of the gate stack 201 and bilayer hardmask structure 203. Portions 215, 216 of the thin conformal oxide layer 209 remain sandwiched between the nitride spacers 211, 212 and the substrate 202. Portions 215, 216 of the thin conformal oxide layer 209 will hereafter be referred to as disposable oxide spacers 215, 216.

FIG. 2F shows the structure of FIG. 2E following the step of etching of exposed areas of the substrate to form a lower source stressor recess 217 and a lower drain stressor recess 218. The disposable nitride spacers 211, 212 and the upper hardmask layer 203B protect the gate stack 201 from damage during this step of etching. Advantageously the lower source and drain stressor recesses 217, 218 are formed by a step of anisotropic reactive ion etching. Advantageously, the depths of the lower source stressor recess 217 and lower drain stressor recess 218 are from about 200 Angstroms to about 2000 Angstroms.

Anisotropic reactive ion etching has the advantage that it is more stable than isotropic etching and does not result in undercut. In this case, undercut refers to the removal of portions of the substrate underlying the disposable nitride spacers 211, 212 and disposable oxide spacers 215, 216.

Formation of stressor regions by etching, followed by deposition of stressor material, is also advantageous over stressor formation by implantation (e.g., implantation of Ge into a silicon substrate). Stressor regions may be formed with superior uniformity when formed by the steps of etching and deposition as opposed to implantation, due to the need for careful control of implantation energies in the case of stressor formation by implantation. It will of course be appreciated that embodiments of the present invention form part of the stressor region by implantation.

FIG. 2G shows the structure of FIG. 2F following selective epitaxial growth of a second semiconductor material in the lower source and drain stressor recesses 217, 218. Deposition of the in-situ doped second semiconductor material results in the formation of an intermediate source stressor region 219 and an intermediate drain stressor region 220 in the source and drain stressor recesses 217, 218 respectively.

Advantageously the selective growth of the second semiconductor material is performed such that growth of second semiconductor material occurs only over exposed surfaces of substrate 202. Advantageously, the intermediate stressor regions 219, 220 are formed such that an upper surface of the intermediate stressor regions 219, 220 is substantially coplanar with an upper surface 202A of the substrate 202. Furthermore it is advantageous that the second semiconductor material is doped in-situ with a dopant.

An advantage of in-situ doping is that a separate dopant implantation step is not required. Furthermore, the uniformity of dopant concentration within the stressor regions may be more closely controlled than in the case of implantation of dopant. More highly activated source and drain stressor regions may also be formed by the step of in-situ doping.

An epitaxy preclean of the exposed surfaces of the substrate is performed prior to selective epitaxial growth so that growth of high quality epitaxial material may take place. Advantageously, the epitaxy preclean is performed using hydrogen fluoride (HF), either in a gaseous or liquid solution form, or by a combination of steps and chemicals that include HF in a gaseous or liquid form. Prior to selective epitaxial growth, a pre-bake step may also be performed to ensure good quality epitaxial layers are formed. The pre-bake step may include the steps of heating to a temperature in the range of about 750° C. to about 1000° C. for a duration in the range of about 2 seconds to about 20 minutes. Advantageously the pre-bake step is performed in a temperature range of about 750° C. to about 850° C. for a duration in the range of about 10 seconds to about 2 minutes.

The ambient atmosphere during the pre-bake step may include a hydrogen ($H_2$) atmosphere. Alternatively a nitrogen ($N_2$) atmosphere, an argon atmosphere, or another atmosphere may be used, such as a combination of both a hydrogen atmosphere and a nitrogen atmosphere. Advantageously the pre-bake step includes a hydrogen atmosphere. Advantageously the epitaxial growth is performed by chemical vapor deposition or molecular beam epitaxy. More advantageously the epitaxial growth is performed by rapid thermal chemical vapor deposition (RTCVD).

Advantageously, in the case of the formation of pFET devices, the second semiconductor material contains a silicon-germanium alloy (hereinafter referred to as silicon germanium). Advantageously, the Ge composition in the silicon germanium is about 10 to about 45 atomic percent. The Ge atoms are advantageously positioned in the substitutional lattice sites in order to produce a strained channel.

Advantageously, in the case of the formation of nFET devices, the second semiconductor material contains a silicon-carbon alloy (hereinafter referred to as silicon carbon). Advantageously, the C composition in the silicon carbon is about 0.1 to about 15 atomic percent. The C atoms are advantageously positioned in the substitutional lattice sites in order to produce a strained channel.

FIG. 2H shows the structure of FIG. 2G following removal of the upper hardmask layer 203B and disposable nitride spacers 211, 212. The upper hardmask layer 203B and disposable nitride spacers 211, 212 may be removed by a step of wet etching. The step of wet etching may include a step of exposing the spacers to a hot phosphoric acid. Alternatively, upper hardmask layer 203B and disposable nitride spacers 211, 212 may be removed by a step of isotropic dry etching.

FIG. 2I shows the structure of FIG. 2H following removal of disposable oxide spacers 215, 216. The disposable oxide spacers 215, 216 may be removed by a step of etching. The step of etching may include a step of wet etching. The step of wet etching may include a step of dipping the structure in a HF liquid solution. Alternatively, the disposable oxide spacers 215, 216 may be removed by a step of dry oxide etching.

The purpose of removing the disposable nitride spacers 211, 212 and the disposable oxide spacers 215, 216 is to expose an area of the substrate wherein an upper source stressor recess 221 and an upper drain stressor recess 222 are to be formed.

FIG. 2J shows the structure of FIG. 2I following a step of etching of exposed areas of the substrate to form the upper source stressor recess 221 and the upper drain stressor recess 222. Upper portions of both the intermediate source stressor region 219 and the intermediate drain stressor region 220 are thereby removed. A lower source stressor region 227 and a lower drain stressor region 228 remain. Lower hardmask layer 203A and offset spacers 207, 208 protect the gate structure 201 from damage during the step of etching. Advantageously the step of etching is performed by reactive ion etching. Advantageously, the depths of the upper source stressor recess 221 and the upper drain stressor recess 222 are from about 100 Angstroms to about 1000 Angstroms.

Advantageously the upper source stressor recess 221 and the upper drain stressor recess 222 each have substantially planar basal surfaces 221A, 222A, respectively, following the step of reactive ion etching. The planar basal surfaces 221A, 222A extend from sidewalls of the spacers 207, 208 with a bottom surface of spacers 207, 208 covered by and in direct contact with the substrate 202. Advantageously, the upper source stressor recess 221 and the upper drain stressor recess 222 are formed by a step of anisotropic reactive ion etching. In the case where isotropic reactive ion etching is used, it is advantageous to ensure that the undercutting does not extend too far beneath the spacers 207, 208, in order to prevent severe short channel effects.

FIG. 2K shows the structure of FIG. 2J following epitaxial growth of an upper source stressor region 225 and an upper drain stressor region 226 in the upper source stressor recess 221 and the upper drain stressor recess 222, respectively. Advantageously, the composition of the upper source stressor region 225 and the upper drain stressor region 226 is the same as that of the intermediate source stressor region 219 and the intermediate drain stressor region 220. Thus, in the case of silicon germanium stressors, advantageously the Ge composition of the upper source stressor region 225 and the upper drain stressor region 226 is the same as that of the intermediate source stressor region 219 and the intermediate drain stressor region 220. Advantageously, the upper stressor regions 225, 226 have the same dopant concentration as the intermediate stressor regions 219, 220.

Alternatively, the composition of the upper stressor regions 225, 226 may be different to that of the intermediate stressor regions 219, 220. Thus, in the case of silicon germanium stressor regions, the Ge composition of the upper stressor regions 225, 226 may be different to that of the intermediate stressor regions 219, 220. In a further alternative, the concentration of dopant in the upper stressor regions 225, 226 may be different to the dopant concentration in the intermediate stressor regions 219, 220.

An epitaxy preclean of the surface of the structure is performed prior to the epitaxial growth step so that growth of high quality epitaxial material may take place. Advantageously the epitaxial growth is performed by chemical vapor deposition, ultrahigh vacuum chemical vapor deposition, or molecular beam epitaxy. More advantageously, the epitaxial growth is performed by rapid thermal chemical vapor deposition.

The upper source stressor region 225 has a source extension stressor region 225A. The upper drain stressor region 226 has a drain extension stressor region 226A. A conduction channel (hereinafter referred to as the 'channel' 229) is defined by adjacent ends 225B, 226B of the source extension stressor region 225A and drain extension stressor region 226A. Thus, the source and drain extension stressor regions 225A, 226A extend to the boundary of the channel 229. This feature has the advantage that a level of stress applied to the channel 229 is enhanced. A portion of the substrate 202 directly beneath the spacers 207,208, isolates the bottom surface of each of the spacers 207, 208, from the source extension stressor region 225A and the drain extension stressor region 226A. Alternatively, the width of the channel 229 may be defined by adjacent ends 225B, 226B of the extension stressor regions 225A, 226A, together with a blurring effect due to diffusion of dopants from the extension stressor regions 225A, 226A toward the channel 229 during a subsequent spike anneal step.

Advantageously, the source extension stressor region 225A and drain extension stressor region 226A are formed such that their upper surfaces are substantially coplanar with the surface 202A of the substrate 202.

However, portions of the upper source stressor region 225 and the upper drain stressor region 226 that are directly above the lower source stressor region 227 and the lower drain stressor region 228, respectively, are formed to protrude above a level of the substrate surface 202A, resulting in the formation of a raised source structure 235 and a raised drain structure 236. Raised source and drain structures have the advantage that device performance is enhanced by the increase in stress or decrease in sheet resistance. Another advantage is that the raised source and drain structure can be used to moderate the stress from a subsequent silicide layer or from a contact etch stop layer.

Alternatively, the upper source and drain stressor regions 225, 226 may be formed such that upper surfaces of the upper source and drain stressor regions 225, 226 are below the level of the surface 202A of the substrate 202.

In a further alternative, the upper source and drain stressor regions 225, 226 may be formed such that their upper surfaces are substantially at the same level as the surface 202A of the substrate 202.

The reason for a difference in thickness within upper stressor regions 225, 226 arises due to a difference in epitaxial growth rates between the cases of homoepitaxial growth of a material and heteroepitaxial growth of that material on silicon.

Heteroepitaxial growth refers to the epitaxial growth of a crystal A on a surface of a substrate of crystal B, in which the structure and chemical composition of crystal A is different from the structure and chemical composition of crystal B. The orientations of crystals A and B with respect to one another may also be different.

Homoepitaxial growth refers to the epitaxial growth of a crystal A on a surface of a substrate of crystal B, where crystals A and B are of the same structure and composition. Furthermore, the orientations of crystals A and B with respect to one another are also the same.

In the case of the growth of epitaxial silicon germanium on a silicon germanium substrate of the same composition, or the growth of epitaxial silicon carbon on a silicon carbon substrate of the same composition, the growth rate is found to be higher than the corresponding growth rates of silicon germanium on silicon, and silicon carbon on silicon, respectively, under otherwise identical conditions.

The structure of FIG. 2K may be formed by terminating the epitaxial growth of second semiconductor material when upper surfaces of the extension stressor regions 225A, 226A are substantially coplanar with the surface 202A of the substrate 202.

As discussed above, the formation of source and drain stressors by etching followed by deposition, has the advantage that more abrupt junction profiles may be produced. This enables improved short channel behaviour to be attained. Advantageously the second semiconductor material is doped in-situ. The step of in-situ doping has the advantage over implantation that a separate implantation step is not required, and enhanced uniformity of dopant concentration may be achieved.

FIG. 2L shows the structure of FIG. 2K after final spacers 231, 232 (also referred to as second spacer elements) have been formed on sidewalls 230 of the offset spacer elements 207, 208 (also referred to as first spacer elements). The final spacers 231, 232 may be formed from a nitride material as in the case of the disposable nitride spacers 211, 212. Alternatively the final spacers 231, 232 may be formed from a different material to the disposable nitride spacers 211, 212. The final spacers 231, 232 are in direct contact with the raised source structure 235 and the raised drain structure 236.

Embodiments of the present invention have been hereinbefore described with reference to the use of hard mask layers. It will be understood that other types of masking layers such as soft mask layers or others could be used.

At this stage, the structure may be subject to a spike anneal in order to form final junctions of the device.

Figure 3A:
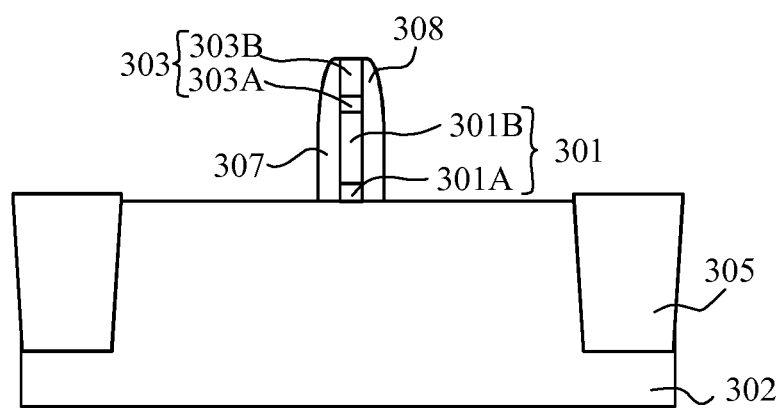
FIGS. 3A, 3B, 3C, 3D, 3E, 3F, 3G and 3H show structures formed during a process of fabrication of a MOSFET in accordance with a further embodiment of the invention.
Figure 3B:
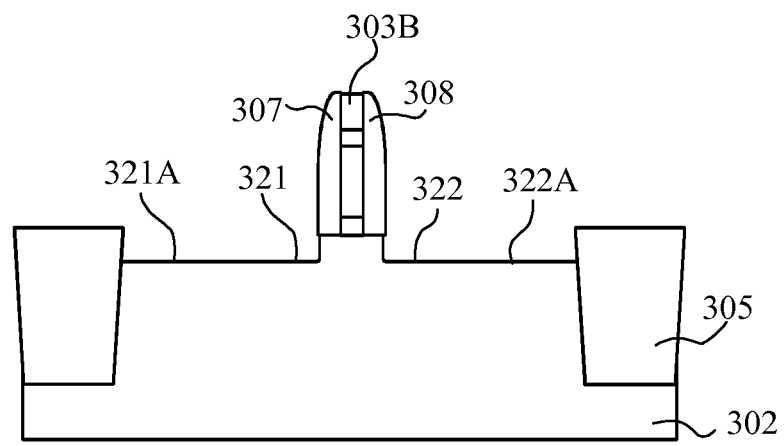
Figure 3C:
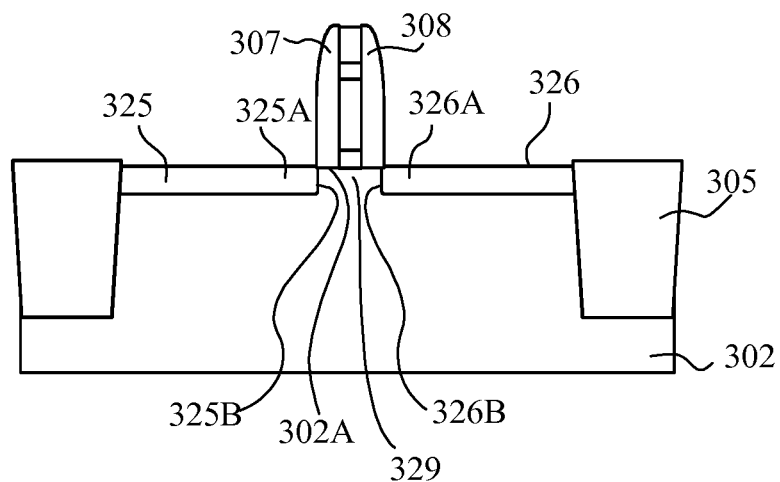
Figure 3D:
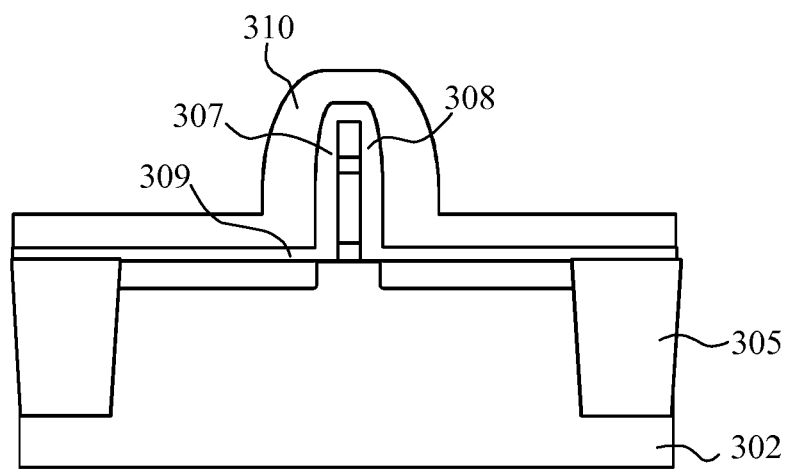
Figure 3E:
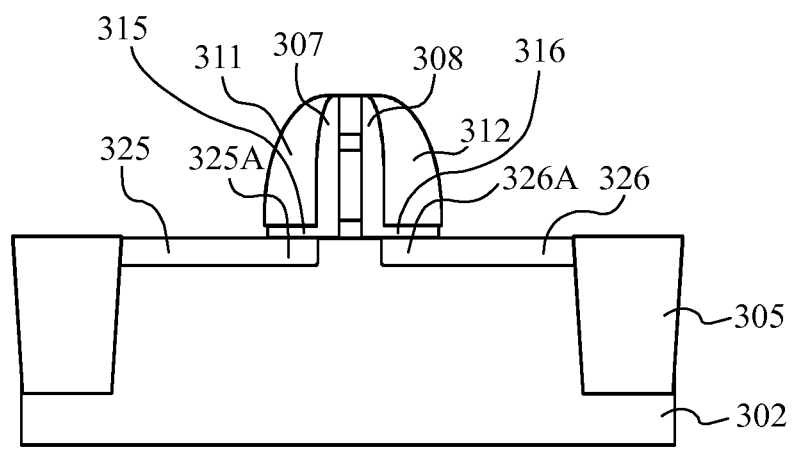
Figure 3F:
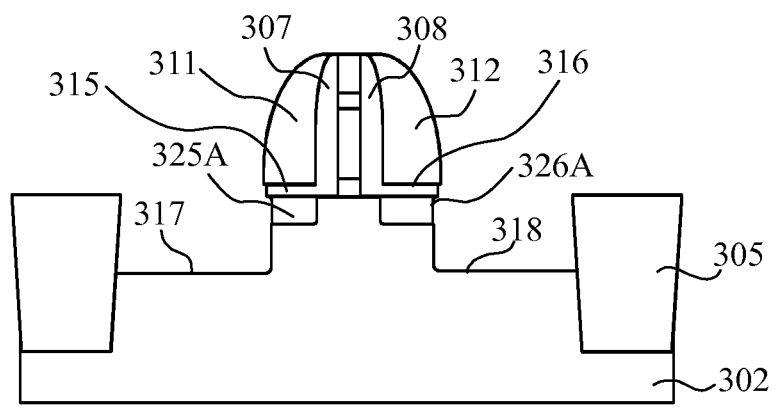
Figure 3G:
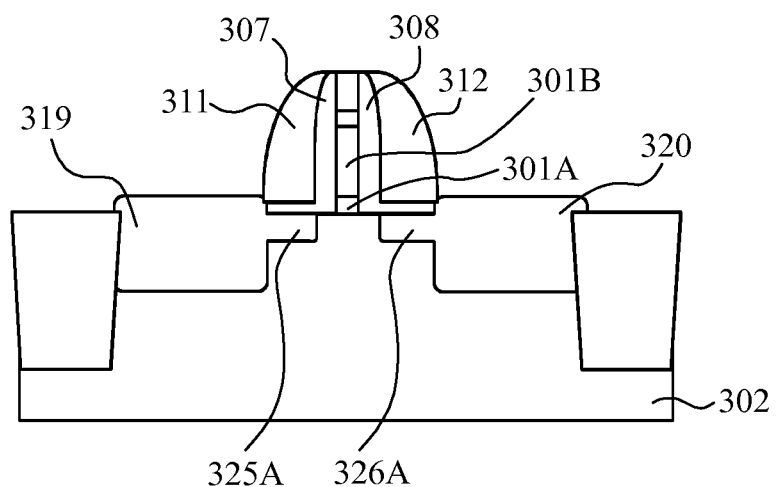
Figure 3H:
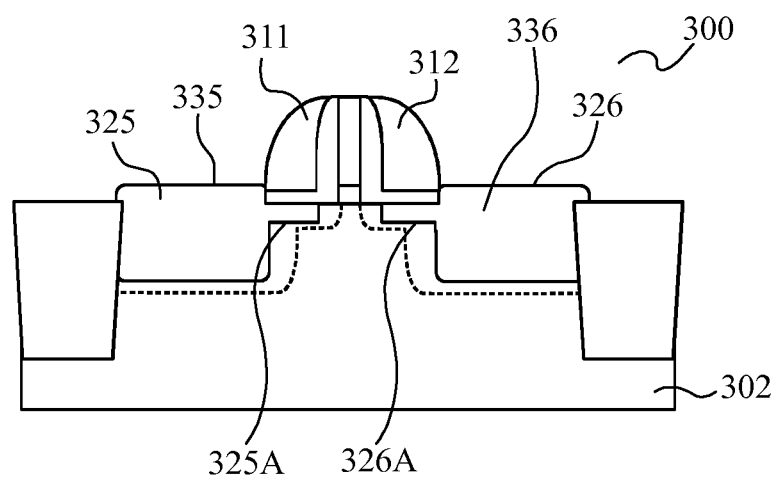

FIGS. 3A to 3H illustrate structures formed during fabrication of a strained channel transistor structure 300 in accordance with a second embodiment of the present invention. The final transistor structure 300 is illustrated in FIG. 3H.

FIG. 3A shows a device structure having a gate structure 301 formed on a substrate 302 of a first semiconductor material which is silicon. Whilst the first semiconductor material is described here as silicon it will be understood that other materials such as germanium or GaAs or others could be used. The gate structure 301 has a gate insulating layer 301A formed on the silicon substrate 302 and a gate electrode 301B formed above the gate insulator layer 301A.

The gate insulator layer 301A is silicon oxide but it will be appreciated that other materials could be used such as silicon nitride, aluminium oxide, hafnium oxide or others alone or in combination, for example a combination of layers of silicon oxide and silicon nitride. Silicon oxide may be grown by thermal oxidation of the silicon substrate. Nitrogen can be introduced into the silicon oxide by means of plasma nitridation or thermal nitridation.

The gate electrode 301B is typically polysilicon, but may alternatively be germanium, nickel silicide, copper, aluminium or others such as polysilicon implanted with a second material such as germanium.

A bilayer hardmask 303 is formed above the gate structure 301, and offset spacers 307, 308 are formed on sidewalls of the gate structure 301 and bilayer hardmask 303. The bilayer hardmask 303 has a lower hardmask layer 303A and an upper hardmask layer 303B. Advantageously, the lower hardmask layer 303A is an oxide layer. Advantageously, the upper hardmask layer 303B is a nitride layer.

Shallow trench isolation (STI) regions 305 are also formed in the substrate 302, as described in the context of the first embodiment of the invention.

FIG. 3B shows the structure of FIG. 3A following a step of anisotropic reactive ion etching of exposed areas of the substrate to form an upper source stressor recess 321 and an upper drain stressor recess 322. In the case where isotropic reactive ion etching is used, it is advantageous to ensure that any undercutting associated with isotropic reactive ion etching does not extend too far beneath the spacers 307, 308 in order to prevent short channel effects. Upper hardmask layer 303B and nitride offset spacers 307, 308 protect the gate structure from damage during the step of reactive ion etching.

Anisotropic reactive ion etching has the advantage that it is more stable than isotropic etching and does not result in undercut, in this case the removal of portions of the substrate underlying the offset spacers 307, 308. Advantageously the depths of the upper source stressor recess 321 and upper drain stressor recess 322 are from about 100 Angstroms to about 1000 Angstroms.

Advantageously the upper source stressor recess 321 and the upper drain stressor recess 322 each have substantially planar basal surfaces 321A, 322A respectively. Advantageously, the upper source stressor recess 321 and the upper drain stressor recess 322 are formed by a step of anisotropic reactive ion etching.

FIG. 3C shows the structure of FIG. 3B following epitaxial growth of a second semiconductor material in the upper source stressor recess 321 and the upper drain stressor recess 322. An epitaxy preclean of the exposed surfaces of the substrate is performed prior to selective epitaxial growth so that growth of high quality epitaxial material may take place. Advantageously the epitaxy preclean is performed using HF, either in a gaseous or liquid solution form, or by a combination of steps and chemicals that include HF in a gaseous or liquid form. Prior to selective epitaxial growth, a pre-bake step may also be performed to ensure good quality epitaxial layers are formed. The pre-bake step may include the steps of heating to a temperature in the range of about 750° C. to about 1000° C. for a duration in the range of about 2 seconds to about 20 minutes. Advantageously the pre-bake step is performed in a temperature range of about 750° C. to about 850° C. for a duration in the range of about 10 seconds to about 2 minutes.

The ambient atmosphere during the pre-bake step may include a hydrogen ($H_2$) atmosphere. Alternatively a nitrogen ($N_2$) atmosphere, an argon atmosphere, or another atmosphere may be used, such as a combination of both a hydrogen atmosphere and a nitrogen atmosphere. Advantageously the pre-bake step includes a hydrogen atmosphere. Advantageously the epitaxial growth is performed by chemical vapor deposition or molecular beam epitaxy. More advantageously the epitaxial growth is performed by rapid thermal chemical vapor deposition (RTCVD).

Deposition of the second semiconductor material results in the formation of an upper source stressor region 325 and an upper drain stressor region 326 in the upper source stressor recess 321 and upper drain stressor recess 322, respectively. Advantageously, an upper surface of the upper source stressor region 325 and the upper drain stressor region 326 is substantially coplanar with an upper surface 302A of the substrate 302.

The upper source stressor region 325 has a source extension stressor region 325A, and the upper drain stressor region 326 has a drain extension stressor region 326A.

Advantageously the second semiconductor material is doped in-situ. The step of in-situ doping has the advantage over implantation that a separate implantation step is not required, and enhanced uniformity of dopant concentration may be achieved. In addition, more highly activated source and drain regions may be formed by in-situ doping.

Formation of stressor regions by etching, followed by deposition of stressor material in a recess formed by etching, is also advantageous over stressor formation by implantation (e.g., implantation of Ge into a silicon substrate). Stressor regions may be formed with superior uniformity when formed by the steps of etching and deposition as opposed to implantation, due to the need for careful control of implantation energies in the case of stressor formation by implantation. It will of course be appreciated that embodiments of the present invention form part of the stressor region by implantation.

A conduction channel (hereinafter referred to as the 'channel' 329) is defined by adjacent ends 325B, 326B of the source extension stressor region 325A and drain extension stressor region 326A. Thus, the source and drain extension stressor regions 325A, 326A extend to the boundary of the channel 329. This feature has the advantage that a level of stress applied to the channel 329 is enhanced. Alternatively, the width of the channel 329 may be defined by adjacent ends 325B, 326B of the extension stressor regions 325A, 326A, together with a blurring effect due to diffusion of dopants from the extension stressor regions 325A, 326A toward the channel 329 during a subsequent spike anneal step.

FIG. 3D shows the structure of FIG. 3C following the deposition of a thin conformal oxide layer 309 over the substrate, and the deposition of a conformal nitride layer 310 over the thin conformal oxide layer 309. The thin conformal oxide layer 309 may be a low temperature oxide (LTO) deposited by plasma enhanced chemical vapor deposition (PECVD). Alternatively, the thin conformal oxide layer 309 may be formed by low pressure chemical vapor deposition (LPCVD) or rapid thermal chemical vapor deposition (RTCVD). Advantageously the thin conformal oxide layer 309 is about 20 Angstroms to about 200 Angstroms in thickness.

The conformal nitride layer 310 may be formed by plasma enhanced chemical vapor deposition (PECVD) or low pressure chemical vapor deposition (LPCVD). Alternatively the conformal nitride layer 310 may be formed by rapid thermal chemical vapor deposition (RTCVD). Advantageously the conformal nitride layer 310 is from about 100 Angstroms to about 700 Angstroms in thickness.

FIG. 3E shows the structure of FIG. 3D following the step of reactive ion etching of the nitride layer 310, and removal of areas of the thin conformal oxide layer 309 exposed by the nitride RIE step. The exposed areas of the thin conformal oxide layer 309 may be removed by a step of etching of these exposed areas. The step of etching of the exposed areas may include a step of dry etching of the exposed areas. Alternatively, the step of etching of the exposed areas may include a step of wet etching of the exposed areas.

The step of reactive ion etching of the nitride layer 310 is performed in order to form nitride spacers 311, 312 on sidewalls of the gate stack structure 301 and bilayer hardmask structure 303. The step of etching of the exposed areas of the thin conformal oxide layer 309 is performed in order to expose areas of the substrate 302. Oxide spacers 315, 316 remain following etching of exposed areas of the thin conformal oxide layer 309. Oxide spacers 315, 316 underlie nitride spacers 311, 312 respectively.

FIG. 3F shows the structure of FIG. 3E following the step of etching of exposed areas of the substrate 302 to form a lower source stressor recess 317 and a lower drain stressor recess 318. The nitride spacers 311, 312 and upper hardmask layer 303B protect the gate structure 301 from damage during this step. Advantageously the lower source stressor recess 317 and the lower drain stressor recess 318 are formed by a step of anisotropic reactive ion etching. Anisotropic reactive ion etching has the advantage over isotropic etching that it is more stable and does not result in undercut of the nitride spacers 311, 312 and oxide spacers 315, 316. Advantageously the depths of the lower source stressor recess 317 and the lower drain stressor recess 318 are from about 200 Angstroms to about 2000 Angstroms.

It may be seen from FIG. 3F that the only portions of the upper stressor regions 325, 326 remaining following this anisotropic etching process are the source extension stressor region 325A and the drain extension stressor region 326A.

FIG. 3G shows the structure of FIG. 3F following epitaxial growth of a deep source stressor region 319 and a deep drain stressor region 320. Advantageously, the composition of the deep source stressor region 319 and the deep drain stressor region 320 is the same as that of the source extension stressor region 325A and the drain extension stressor region 326A.

Alternatively, a composition of the deep source stressor region 319 and the deep drain stressor region 320 may be different to that of the source extension stressor region 325A and the drain extension stressor region 326A.

Advantageously, the steps of epitaxial growth of the deep source stressor region 319 and the deep drain stressor region 320 includes the steps of in-situ doping of the deep source stressor region 319 and the deep drain stressor region 320. If the deep source/drain stressors are undoped, conventional ion implantation and annealing can be performed to form doped deep source/drain stressor regions.

An epitaxial preclean of the surface of the structure is again performed before the epitaxial growth of the stressor regions 319, 320 is performed. Advantageously, the epitaxial growth of the stressor regions 319, 320 is performed by rapid thermal chemical vapor deposition (RTCVD). Alternatively, the epitaxial growth of the stressor regions 319, 320 may be performed by chemical vapor deposition, ultra-high vacuum chemical vapor deposition or molecular beam epitaxy.

The formation of source and drain stressor regions by etching followed by deposition has the advantage that more abrupt junction profiles may be produced. This enables improved short channel behaviour to be attained.

From FIG. 3G it may be seen that the deep source stressor region 319 and deep drain stressor region 320 are formed such that their upper surfaces protrude above the level of the substrate surface 302A. A raised source and drain structure is thereby formed. Raised source and drain structures have the advantage that device performance is enhanced.

Alternatively, the upper source and drain stressor regions 325, 326 may be formed such that upper surfaces of the upper source and drain stressor regions 325, 326 are below the level of the surface 302A of the substrate 302.

In a further alternative, the upper source and drain stressor regions 325, 326 may be formed such that their upper surfaces are substantially at the same level as the surface 302A of the substrate 302.

FIG. 3H shows the structure of FIG. 3G following removal of the hardmask bilayer 303 and upper portions of nitride spacers 311, 312. A step of spike annealing may be performed at this stage to form final junctions of the structure.

In both the first and second preferred embodiments of the invention the source stressor regions 235, 335 and the drain stressor regions 236, 336 are formed by in-situ doping during epitaxial growth of the stressor regions. Consequently the source extension stressor regions 225A, 325A and drain extension stressor regions 226A, 326A may be made highly activated.

Furthermore, the profiles of junctions between the source stressor regions 235, 335 and the substrate 202, 302, respectively, and between the drain stressor regions 236, 336 and the substrate 202, 302, respectively, are determined by an etch profile. Consequently, highly abrupt junctions may be formed. This enables excellent short channel behaviour to be attained by the transistor structure.

Embodiments of the present invention have been hereinbefore described with reference to the use of hard mask layers. It will be understood that other types of masking layers such as soft mask layers or others could be used.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A strained channel transistor structure, comprising:
  a substrate;
  a source stressor region on the substrate and comprising a source extension stressor region;
  a drain stressor region on the substrate and comprising a drain extension stressor region;

a strained channel region between the source extension stressor region and the drain extension stressor region, a width of said channel region being defined by adjacent ends of said extension stressor regions;

a gate stack above the strained channel region;

a spacer element in direct contact with the gate stack, a bottom surface of the spacer element covered by and in direct contact with the substrate, the source extension stressor region and the drain extension stressor region isolated from direct contact with the bottom surface of the spacer element by the substrate; and a final spacer on the spacer element and in direct contact with a raised source structure of the source stressor region and a raised drain structure of the drain stressor region, wherein the raised source structure and the raised drain structure protruding above the substrate.

2. The structure as claimed in claim 1, wherein at least one of the source and drain stressor regions further comprises:
a lower stressor region; and
an upper stressor region; wherein
the upper stressor region comprises the stressor extension region.

3. The structure as claimed in claim 2, wherein for each of said source and drain stressor region a width of said upper stressor region is greater than a width of said lower stressor region.

4. The structure as claimed in claim 3 wherein:
the channel region is formed from a first semiconductor material having a first natural lattice constant; and
the stressor regions are formed from a second semiconductor material having a second natural lattice constant.

5. The structure as claimed in claim 4, wherein:
the gate stack includes a gate dielectric layer and a gate electrode.

6. The structure as claimed in claim 5 wherein the final spacer is in direct contact with the spacer element.

7. The structure as claimed in claim 6 wherein the final spacer includes:
a source side final spacer in direct contact with a source side sidewall of the spacer element; and
a drain side final spacer in direct contact with a drain sidewall of the spacer element.

8. The structure as claimed in claim 7 wherein:
the source extension stressor region extends under a portion of the source side final spacer and the drain extension stressor region extends under a portion of the drain side final spacer.

9. The structure as claimed in claim 8 wherein the spacer element is formed from a low temperature oxide.

10. The structure as claimed in claim 9 wherein the final spacer is formed from a nitride material.

11. A strained channel transistor structure, comprising:
a substrate;
a source stressor region on the substrate; and
a drain stressor region on the substrate; and
wherein:
each stressor region comprises a lower stressor region and an upper stressor region, said upper stressor region comprising a stressor extension region; and
a width of at least one of said source and drain upper stressor regions is greater than a width of the lower source stressor region; and
further comprising:
a gate stack above the stressor regions;
a spacer element in direct contact with the gate stack, a bottom surface of the spacer element covered by and in direct contact with the substrate, the source extension stressor region and the drain extension stressor region isolated from direct contact with the bottom surface of the spacer element by the substrate; and a final spacer on the spacer element and in direct contact with a raised source structure of the source stressor region and a raised drain structure of the drain stressor region, wherein the raised source structure and the raised drain structure protrude above the substrate.

12. The structure of claim 11 further comprising a strained channel region between said source stressor region and said drain stressor region, a width of the channel region being defined by an end of the source stressor extension region and an end of the drain stressor extension region.

13. The structure as claimed in claim 12 wherein the channel is formed from a first semiconductor material having a first natural lattice constant and the stressors are formed from a second semiconductor material having a second natural lattice constant different from the first.

14. The structure as claimed in claim 13, wherein:
the gate stack includes a gate dielectric layer and a gate electrode.

15. The structure as claimed in claim 14 wherein the final spacer is in direct contact with the spacer element.

16. The structure as claimed in claim 15 wherein the final spacer includes:
a source side final spacer in direct contact with a source side sidewall of the spacer element; and
a drain side final spacer in direct contact with a drain sidewall of the spacer element.

17. The structure as claimed in claim 16 wherein:
the source extension stressor region extends under a portion of the source side final spacer and the drain extension stressor region extends under a portion of the drain side final spacer.

18. The structure as claimed in claim 17 wherein the spacer element is formed from a low temperature oxide.

19. The structure as claimed in claim 18 wherein the final spacer is formed from a nitride material.

20. A method of forming a strained channel transistor structure on a substrate comprising a first semiconductor material, comprising the steps of:
providing a substrate;
etching on the substrate a lower source stressor recess and a lower drain stressor recess and filling said lower stressor recesses with a second semiconductor material;
subsequently etching on the substrate an upper source stressor recess and an upper drain stressor recess and filling said upper stressor recesses with said second semiconductor material;
forming a source extension stressor region;
forming a drain extension stressor region;
forming a channel region between said source extension stressor region and said drain extension stressor region, said channel region having a width defined by adjacent ends of said extension stressor regions;
forming a gate stack above the channel region;
forming a spacer element in direct contact with the gate stack, a bottom surface of the spacer element covered by and in direct contact with the substrate, the source extension stressor region and the drain extension stressor region isolated from direct contact with the bottom surface of the spacer element by the substrate; and
forming a final spacer on the spacer element and in direct contact with a raised source structure of the source stressor region and a raised drain structure of the drain stressor region, wherein the raised source structure and the raised drain structure protrude above the substrate.

21. The method as claimed in claim 20 further comprising the steps of:
    forming an upper source stressor region and a lower source stressor region, the upper source stressor region comprising the source extension stressor region; and
    forming an upper drain stressor region and a lower drain stressor region, the upper drain stressor region comprising the drain extension stressor region.

22. The method as claimed in claim 21 comprising the steps of:
    forming the upper stressor regions having a width greater than a width of the lower stressor region.

23. The method as claimed in claim 22 wherein:
    forming the gate stack includes forming a gate electrode over a gate dielectric layer.

24. The method as claimed in claim 23 wherein the step of forming the gate stack is performed prior to the step of forming the source and drain stressor regions.

25. The method as claimed in claim 24 wherein the step of etching the lower source stressor recess and the lower drain stressor recess is preceded by the step of forming the spacer element of a first width on each of a pair of opposing sidewalls of the gate stack.

26. The method as claimed in claim 25 wherein the step of etching the upper source stressor recess is preceded by the step of reducing a width of said spacer element to a second width smaller than the first width.

27. The method as claimed in claim 26 wherein the step of etching said stressor recesses comprises the step of anisotropic etching said stressor recesses.

28. The method as claimed in claim 27 wherein said step of anisotropic etching said stressor recesses comprises the step of reactive ion etching (RIE) said stressor recesses.

29. The method as claimed in claim 28 wherein the step of filling said recesses with second semiconductor material comprises the step of in-situ doping said second semiconductor material.

30. The method as claimed in claim 29 wherein the steps of filling said upper source stressor recess and said upper drain stressor recess with a second semiconductor material comprises the steps of forming a raised source stressor region and a raised drain stressor region.

31. The method as claimed in claim 22 further comprising the steps of:
    etching an upper source stressor recess and an upper drain stressor recess and filling said upper stressor recesses with a second semiconductor material; and
    subsequently etching a lower source stressor recess and a lower drain stressor recess and filling said lower stressor recesses with said second semiconductor material.

32. The method as claimed in claim 31 wherein:
    forming the gate stack includes a gate electrode over a gate dielectric layer.

33. The method as claimed in claim 32 wherein the steps of forming the gate stack is performed prior to the steps of forming the source and drain stressor regions.

34. The method as claimed in claim 33 wherein the steps of etching the upper stressor recesses is preceded by the steps of forming the final spacer on each of a pair of opposing sidewalls of the spacer element.

35. The method as claimed in claim 34 wherein the steps of etching the lower stressor recesses is preceded by the steps of forming a conformal oxide layer for forming the spacer element.

36. The method as claimed in claim 35 wherein the steps of etching said stressor recesses comprise the steps of anisotropic etching said stressor recesses.

37. The method as claimed in claim 36 wherein said steps of anisotropic etching said stressor recesses comprise the steps of reactive ion etching (RIE) said stressor recesses.

38. The method as claimed in claim 37 wherein the steps of filling said recesses with second semiconductor material comprises the steps of in-situ doping said second semiconductor material.

39. The method as claimed in claim 38 wherein the steps of filling said upper source stressor recess and said upper drain stressor recess with a second semiconductor material comprises the steps of forming a raised source stressor region and a raised drain stressor region.

* * * * *